(12) United States Patent
Nagano

(10) Patent No.: US 11,973,480 B2
(45) Date of Patent: Apr. 30, 2024

(54) VARIABLE CAPACITANCE CIRCUIT AND WIRELESS COMMUNICATION DEVICE

(71) Applicant: SONY SEMICONDUCTOR SOLUTIONS CORPORATION, Kanagawa (JP)

(72) Inventor: Hiroaki Nagano, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 600 days.

(21) Appl. No.: 17/268,013

(22) PCT Filed: Jul. 17, 2019

(86) PCT No.: PCT/JP2019/028096
§ 371 (c)(1),
(2) Date: Feb. 11, 2021

(87) PCT Pub. No.: WO2020/049877
PCT Pub. Date: Mar. 12, 2020

(65) Prior Publication Data
US 2021/0242859 A1  Aug. 5, 2021

(30) Foreign Application Priority Data

Sep. 4, 2018  (JP) ................................. 2018-165144

(51) Int. Cl.
*H03H 11/28* (2006.01)
*H01Q 1/50* (2006.01)
*H03K 17/687* (2006.01)

(52) U.S. Cl.
CPC ............... *H03H 11/28* (2013.01); *H01Q 1/50* (2013.01); *H03K 17/6872* (2013.01); *H03K 17/6874* (2013.01)

(58) Field of Classification Search
CPC ........ H01L 27/088; H01Q 1/50; H03H 11/28; H03H 5/12; H03H 7/38; H03K 17/6871; H03K 17/6872; H03K 17/6874
See application file for complete search history.

(56) References Cited

U.S. PATENT DOCUMENTS 6,917,248 B2 * 7/2005 Nguyen ............... H03B 5/1231
   331/177 V
8,903,333 B1 * 12/2014 Khlat ..................... H04B 1/525
   343/750

(Continued)

FOREIGN PATENT DOCUMENTS

JP   2005-064691   3/2005
JP   2011-040811   2/2011

(Continued)

OTHER PUBLICATIONS

International Search Report prepared by the Japan Patent Office dated Aug. 23, 2019, for International Application No. PCT/JP2019/028096.

(Continued)

*Primary Examiner* — Thien M Le
(74) *Attorney, Agent, or Firm* — Sheridan Ross PC

(57) ABSTRACT

To achieve higher self-resonant frequency and lower parasitic resistance of a variable capacitance circuit whose capacitance value is changeable. The variable capacitance circuit includes a capacitor unit, a reactive element, and a bias circuit. The capacitor unit inside the variable capacitance circuit includes plural semiconductor elements connected in series, the plural semiconductor elements each having a capacitance value based on a bias voltage applied thereto. Further, the reactive element inside the variable capacitance circuit is connected to the capacitor unit. The (Continued)

bias circuit inside the variable capacitance circuit applies a bias voltage to each of the plural semiconductor elements.

20 Claims, 20 Drawing Sheets

(56) References Cited

U.S. PATENT DOCUMENTS

| | | | |
|---|---|---|---|
| 9,209,784 B2* | 12/2015 | Iversen | H03K 17/102 |
| 11,063,365 B2* | 7/2021 | de Rochemont | H01Q 9/16 |
| 2005/0030116 A1 | 2/2005 | Takagi et al. | |
| 2005/0264335 A1 | 12/2005 | Soe | |
| 2012/0013375 A1 | 1/2012 | Kuramochi | |
| 2014/0008544 A1* | 1/2014 | Kameshima | H04N 25/60 |
| | | | 250/394 |
| 2014/0362062 A1* | 12/2014 | Limketkai | G09G 3/3233 |
| | | | 345/82 |
| 2015/0301180 A1* | 10/2015 | Stettner | G01S 7/4818 |
| | | | 257/448 |
| 2016/0379034 A1* | 12/2016 | Lin | H01L 27/14612 |
| | | | 382/124 |
| 2017/0345620 A1 | 11/2017 | Coumou | |
| 2020/0014121 A1* | 1/2020 | Maccabe | H01Q 15/24 |
| 2020/0292642 A1* | 9/2020 | Yang | G01R 33/3415 |
| 2021/0242859 A1* | 8/2021 | Nagano | H01Q 1/50 |
| 2023/0094219 A1* | 3/2023 | Takatsuka | H04N 25/773 |
| | | | 257/292 |

FOREIGN PATENT DOCUMENTS

| | | |
|---|---|---|
| JP | 2012-023626 | 2/2012 |
| WO | WO 2010/098255 | 9/2010 |

OTHER PUBLICATIONS

Kuhn et al., "Process Technology Variation," IEEE Transactions on Electron Devices, vol. 58, No. 8, Aug. 2011, pp. 2197-2208.

* cited by examiner

FIG.5
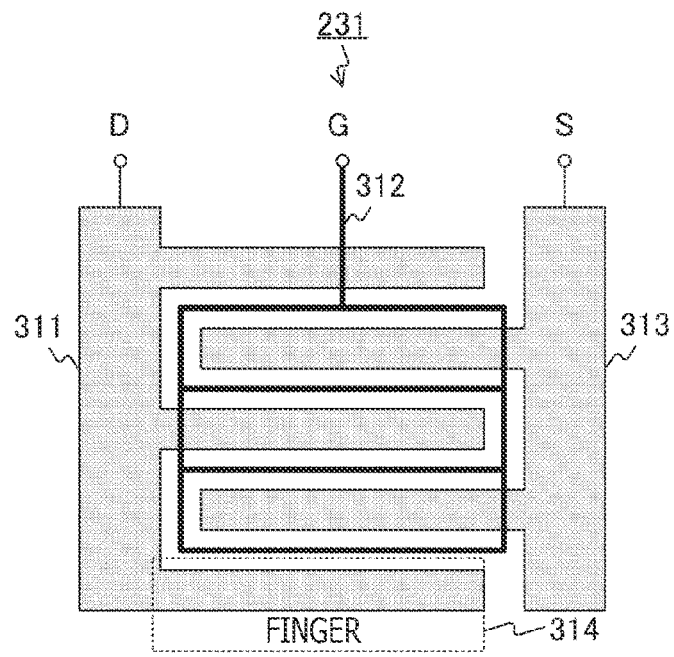
a
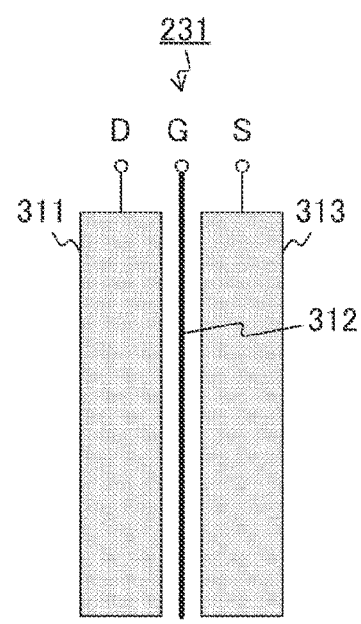
b

FIG.8

| CONTROL SIGNAL (3 bits) | TRANSISTOR | | | COMBINED CAPACITANCE |
|---|---|---|---|---|
| | 231 | 232 | 233 | |
| 000 | OFF | OFF | OFF | $C_{off}/3$ |
| 001 | OFF | OFF | ON | $C_{off}/2$ |
| 100 | ON | OFF | OFF | |
| 010 | OFF | ON | OFF | |
| 011 | OFF | ON | ON | $C_{off}$ |
| 101 | ON | OFF | ON | |
| 110 | ON | ON | OFF | |

| CONTROL SIGNAL SW1 (2 bits) | TRANSISTOR 231 | |
|---|---|---|
| | STATE | CAPACITANCE |
| 10 | ON | 0 |
| 01 | OFF | $C_{off1}$ |
| 00 | OFF | $C_{off2}$ |

FIG.14

|  | GATE WIDTH | OFF CAPACITANCE |
|---|---|---|
| TRANSISTOR 231 | Wg1 | $C_{off}$ |
| TRANSISTOR 232 | Wg2 (=Wg1/2) | $C_{off}/2$ |
| TRANSISTOR 233 | Wg3 (=Wg1/4) | $C_{off1}/4$ |

FIG.15

| CONTROL SIGNAL (3 bits) | TRANSISTOR | | | COMBINED CAPACITANCE |
|---|---|---|---|---|
| | 231 | 232 | 233 | |
| 000 | OFF | OFF | OFF | $C_{off}/7$ |
| 001 | OFF | OFF | ON | $C_{off}/3$ |
| 100 | ON | OFF | OFF | $C_{off}/6$ |
| 010 | OFF | ON | OFF | $C_{off}/5$ |
| 011 | OFF | ON | ON | $C_{off}$ |
| 101 | ON | OFF | ON | $C_{off}/2$ |
| 110 | ON | ON | OFF | $C_{off}/4$ |

| CONTROL SIGNAL (6 bits) | TRANSISTOR | | | | | | COMBINED CAPACITANCE |
|---|---|---|---|---|---|---|---|
| | 261 | 271 | 281 | 262 | 272 | 282 | |
| 000000 | OFF | OFF | OFF | OFF | OFF | OFF | $(C_1+C_2+C_3)/(N+1)$ |
| 000100 | OFF | OFF | OFF | ON | OFF | OFF | $C_1+(C_2+C_3)/(N+1)$ |
| 000010 | OFF | OFF | OFF | OFF | ON | OFF | $C_2+(C_1+C_3)/(N+1)$ |
| 0000001 | OFF | OFF | OFF | OFF | OFF | ON | $C_3+(C_1+C_2)/(N+1)$ |
| 000110 | OFF | OFF | OFF | ON | ON | OFF | $C_1+C_2+C_3/(N+1)$ |
| 000011 | OFF | OFF | OFF | OFF | ON | ON | $C_2+C_3+C_1/(N+1)$ |
| 000101 | OFF | OFF | OFF | ON | OFF | ON | $C_1+C_3+C_2/(N+1)$ |
| 000111 | OFF | OFF | OFF | ON | ON | ON | $C_1+C_2+C_3$ |
| 111111 | ON | ON | ON | ON | ON | ON | 0 |
| 001001 | OFF | OFF | ON | OFF | OFF | ON | 0 |
| 100100 | ON | OFF | OFF | ON | OFF | OFF | 0 |
| 010010 | OFF | ON | OFF | OFF | ON | OFF | 0 |
| 011011 | OFF | ON | ON | OFF | ON | ON | 0 |
| 101101 | ON | OFF | ON | ON | OFF | ON | 0 |
| 110110 | ON | ON | OFF | ON | ON | OFF | 0 |

FIG.19
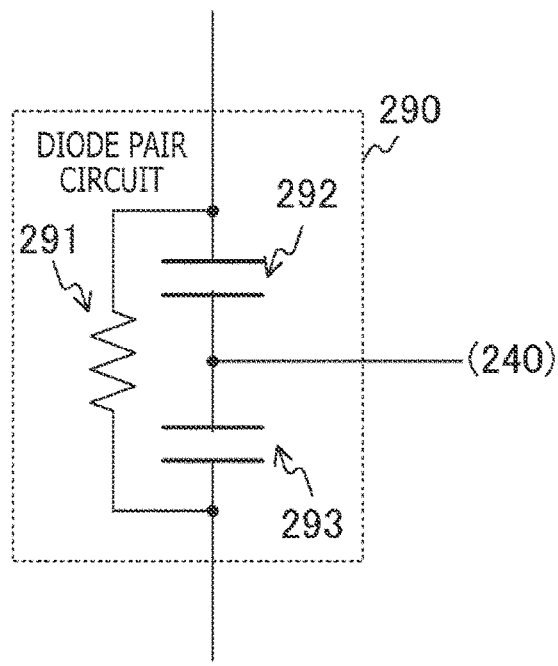
a
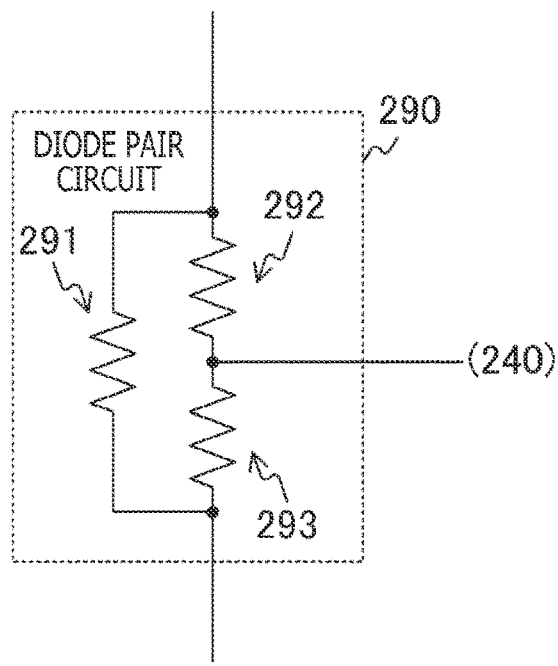
b

VARIABLE CAPACITANCE CIRCUIT AND WIRELESS COMMUNICATION DEVICE

CROSS REFERENCE TO RELATED APPLICATIONS

This application is a national stage application under 35 U.S.C. 371 and claims the benefit of PCT Application No. PCT/JP2019/028096 having an international filing date of 17 Jul. 2019, which designated the United States, which PCT application claimed the benefit of Japanese Patent Application No. 2018-165144, filed 4 Sep. 2018, the entire disclosures of each of which are incorporated herein by reference.

TECHNICAL FIELD

The present technology relates to a variable capacitance circuit and a wireless communication device. Specifically, the present technology relates to a variable capacitance circuit and a wireless communication device that receive wireless signals.

BACKGROUND ART

Hitherto, in wireless communication devices and the like, variable capacitors have been used for the purpose of performing impedance matching, antenna tuning, noise reduction, signal generation, or the like. For example, there has been proposed a wireless communication device having disposed therein a variable capacitance circuit including plural capacitors having one ends connected to an antenna in parallel, and a switch group configured to individually ground the other ends of those capacitors (for example, see PTL 1). In particular, in a wireless communication device that uses a high frequency, when a circuit is mounted on the semiconductor substrate, interdigital capacitors are often used in consideration of the advantage of interdigital capacitors that even small-capacitance interdigital capacitors have small manufacturing variations.

Here, an interdigital capacitor is a capacitor including a pair of metallic finger sets each having provided thereto plural protruding wires as fingers, and a dielectric. The fingers of one of the pair of finger sets and the fingers of the other finger set are alternately arrayed, and the dielectric is disposed between those fingers. With this configuration, the capacitance value of line-to-line capacitance between the fingers (wires) is generated.

CITATION LIST

Patent Literature

[PTL 1]
JP 2014-82748A

SUMMARY

Technical Problems

In the related art described above, the capacitance value of the variable capacitance circuit is changed by controlling the switch group so that adjustment depending on the application, such as impedance matching, antenna resonant frequency adjustment, filter characteristic change, or signal frequency change, and desired characteristics can be achieved. However, in a variable capacitance circuit using interdigital capacitors, it is difficult to achieve a high self-resonant frequency that is a frequency when the capacitance value is maximum. This is because the fingers (wires) have parasitic inductance. Since signals at a higher frequency can flow through a variable capacitance circuit with a higher self-resonant frequency, a high self-resonant frequency is needed in a case where high frequency wireless signals such as millimeter waves are transmitted or received.

The present technology has been made in view of such circumstances, and has an object to achieve higher self-resonant frequency and lower parasitic resistance of a variable capacitance circuit whose capacitance value is changeable.

Solution to Problems

The present technology has been made to solve the above-mentioned problems, and according to a first aspect of the present technology, there is provided a variable capacitance circuit including a capacitor unit including plural semiconductor elements connected in series, the plural semiconductor elements each having a capacitance value based on a bias voltage applied thereto, a reactive element connected to the capacitor unit, and a bias circuit configured to apply the bias voltage to each of the plural semiconductor elements. This provides an action that the combined capacitance of the capacitor unit changes depending on the bias voltage.

Further, in this first aspect, the plural semiconductor elements may be respective transistors, and the bias circuit may apply, as the bias voltage, any of an on voltage for turning on the transistors and an off voltage for turning off the transistors. This provides an action that the combined capacitance changes depending on the number of transistors in the off state.

Further, in this first aspect, the off voltage may include plural voltages different from each other, and the bias circuit may apply any of the on voltage and the plural voltages as the bias voltage. This provides an action that the combined capacitance changes depending on the number of transistors in the off state and the off voltage.

Further, in this first aspect, at least two of the transistors may have different gate widths. This provides an action that the combined capacitance of the transistors having the different gate widths changes depending on the bias voltage.

Further, in this first aspect, the transistors may each be a transistor including a gate electrode with a linear shape instead of a related-art meander or comb shape. This provides an action that the parasitic inductance drops.

Further, in this first aspect, the plural semiconductor elements may each be a diode pair circuit including a pair of diodes having anodes connected to each other, and the bias circuit may apply any of a forward voltage and a backward voltage to the pair of diodes individually as the bias voltage. This provides an action that the combined capacitance changes depending on the number of diode pair circuits that have received the backward voltage.

Further, in this first aspect, plural array circuits connected in parallel may be disposed in the capacitor unit, and the plural semiconductor elements may be disposed in each of the plural array circuits. This provides an action that the combined capacitance of the plural array circuits connected in parallel changes depending on the bias voltage.

Further, in this first aspect, the reactive element may be connected to the capacitor unit in series. This provides an action that the impedance of the circuit to which the reactive element and the capacitor unit are connected in series changes.

Further, in this first aspect, the reactive element may be an antenna radiator. This provides an action that the resonant frequency of the circuit to which the antenna radiator and the capacitor unit are connected in series changes.

Further, in this first aspect, the capacitor unit may be connected to each end of the reactive element. This provides an action that the resonant frequency or the impedance changes depending on the bias voltage.

Further, in this first aspect, the reactive element may be connected to the capacitor unit in parallel. This provides an action that the impedance of the circuit to which the reactive element and the capacitor unit are connected in parallel changes.

Further, according to a second aspect of the present technology, there is provided a wireless communication device including a capacitor unit including plural semiconductor elements connected in series, the plural semiconductor elements each having a capacitance value based on a bias voltage applied thereto, a reactive element connected to the capacitor unit, a bias circuit configured to apply the bias voltage to each of the plural semiconductor elements, and an antenna radiator connected to at least one of the capacitor unit or the reactive element. This provides an action that the resonant frequency of the wireless communication device changes depending on the bias voltage.

Advantageous Effects of Invention

According to the present technology, there may be provided excellent effects of achieving higher self-resonant frequency and lower parasitic resistance of the variable capacitance circuit whose capacitance value is changeable. Note that, the effects described here are not necessarily limited and may be any effect described in the present disclosure.

BRIEF DESCRIPTION OF DRAWINGS

FIG. 5 illustrates examples of plan views of a MOS (Metal-Oxide-Semiconductor) transistor according to the first embodiment of the present technology.

FIG. 8 is a diagram illustrating an example of combined capacitance control according to the first embodiment of the present technology.

FIG. 14 is a diagram illustrating an example of a gate width of each MOS transistor according to a third embodiment of the present technology.

FIG. 15 is a diagram illustrating an example of combined capacitance control according to the third embodiment of the present technology.

FIG. 17 is a diagram illustrating an example of combined capacitance control according to the fourth embodiment of the present technology.

FIG. 19 illustrates examples of equivalent circuits of a diode pair circuit according to the fifth embodiment of the present technology.

DESCRIPTION OF EMBODIMENTS

Now, modes for carrying out the present technology (hereinafter referred to as "embodiments") are described. The following items are described in order.

1. First embodiment (an example in which plural transistors are connected in series)
2. Second embodiment (an example in which the plural transistors are connected in series and an off voltage is controlled in two stages)
3. Third embodiment (an example in which the plural transistors having different gate widths are connected in series)
4. Fourth embodiment (an example in which plural array circuits each having disposed therein plural transistors connected in series are connected in parallel)
5. Fifth embodiment (an example in which plural diode pair circuits are connected in series)
6. Sixth embodiment (an example in which the plural transistors are connected in series in an antenna tuning circuit)
7. Seventh embodiment (an example in which the plural transistors are connected in series in a resonant circuit)

1. First Embodiment

[Configuration Example of Wireless Communication Device]

Figure 1:
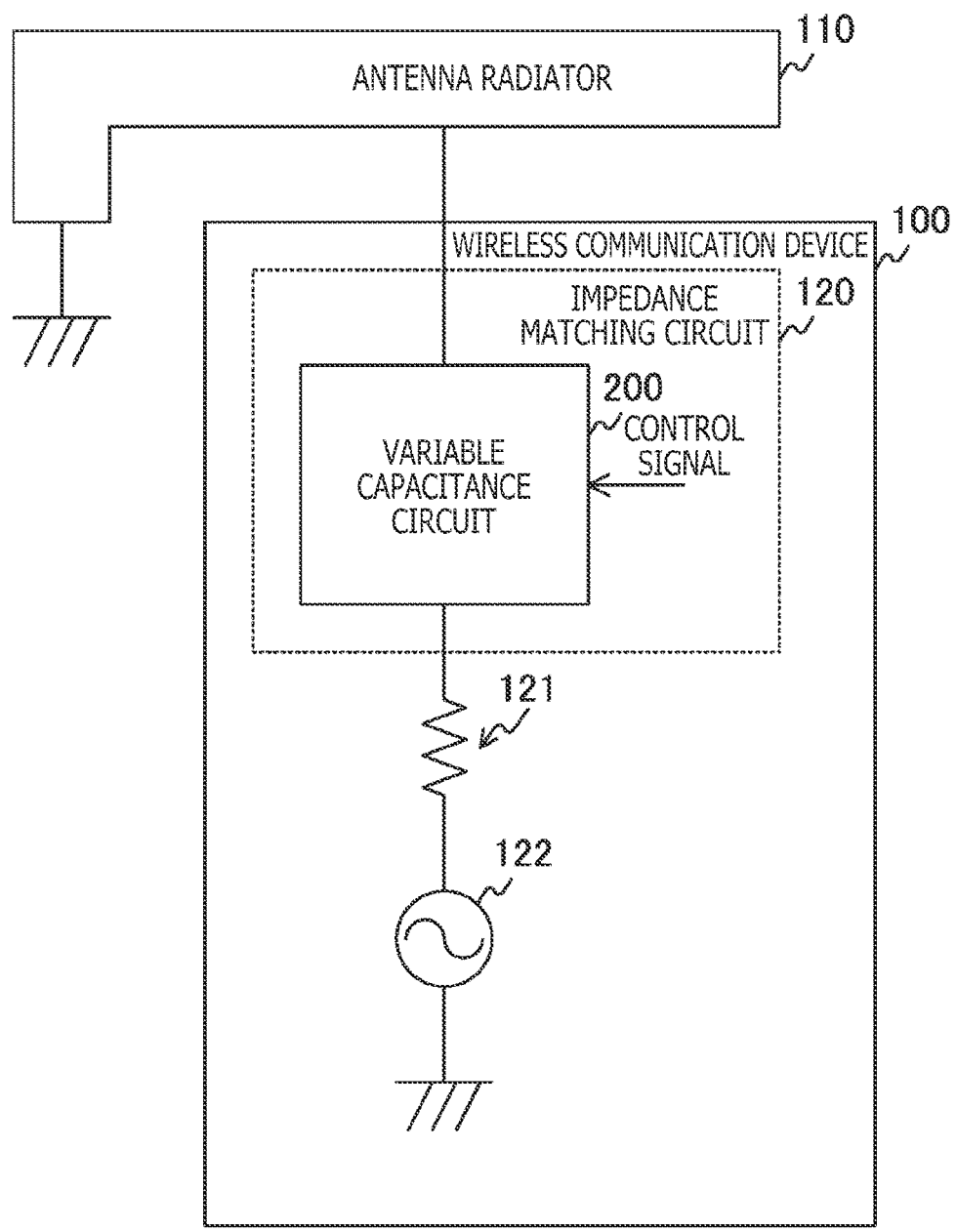
FIG. 1 is a circuit diagram illustrating a configuration example of a wireless communication device according to a first embodiment of the present technology.

FIG. 1 is a circuit diagram illustrating a configuration example of a wireless communication device 100 according to a first embodiment of the present technology. The wireless communication device 100 is a device configured to transmit/receive wireless signals and includes an antenna radiator 110 and an impedance matching circuit 120. The impedance matching circuit 120 is a circuit configured to perform impedance matching to prevent reflection due to another circuit.

A variable capacitance circuit 200 is a circuit whose capacitance value changes depending on control signals. The variable capacitance circuit 200 is connected to the antenna radiator 110 in parallel, and a resistive element 121 and a signal source 122 are connected to the antenna radiator 110 in series.

The antenna radiator 110 is a portion of the antenna that is connected to a feeding point to which AC (Alternate Current) signals are supplied from the signal source 122 and that is also called an "element." The signal source 122 supplies AC signals.

[Configuration Example of Variable Capacitance Circuit]

Figure 2:
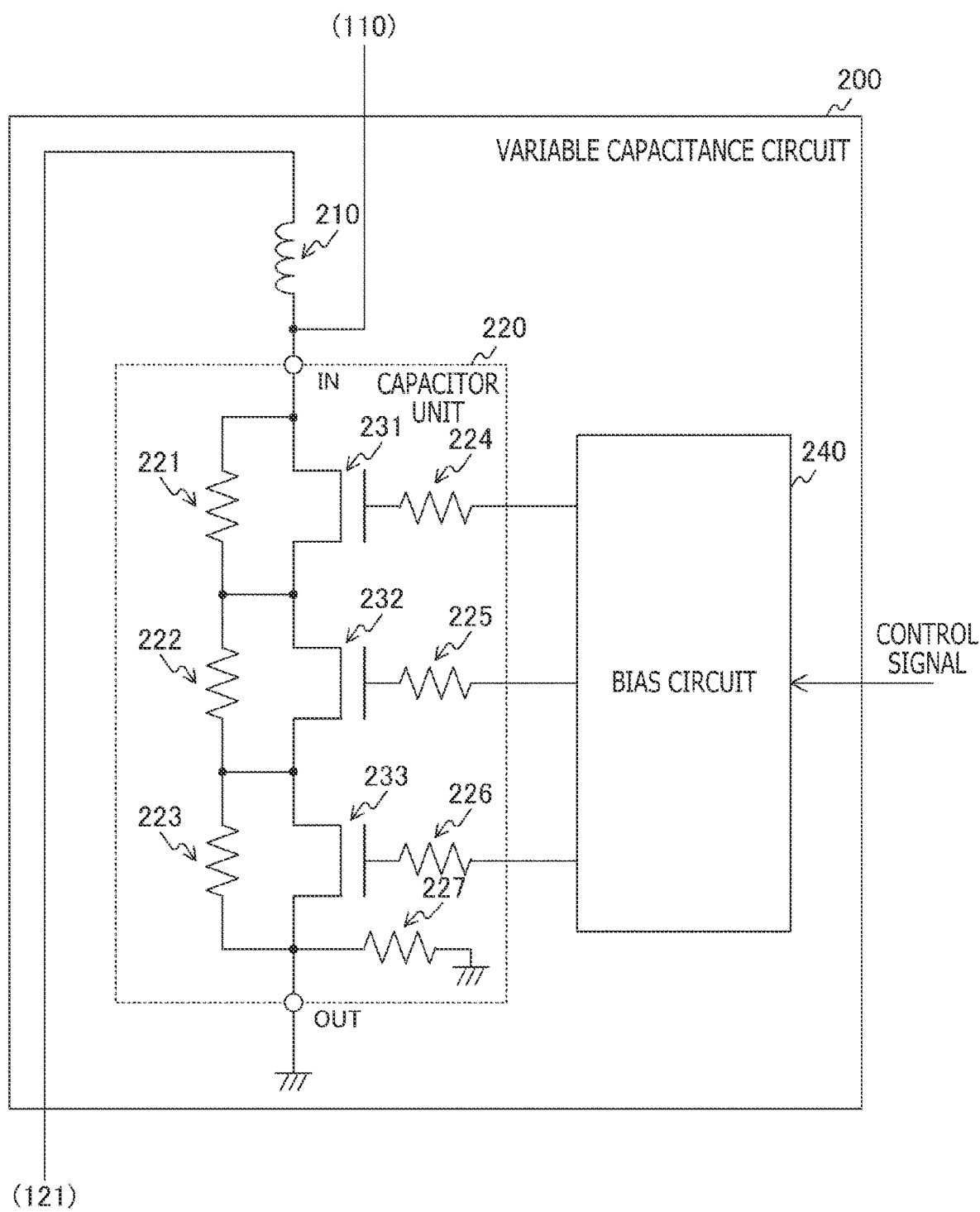
FIG. 2 is a circuit diagram illustrating a configuration example of a variable capacitance circuit according to the first embodiment of the present technology.

FIG. 2 is a circuit diagram illustrating a configuration example of the variable capacitance circuit 200 according to the first embodiment of the present technology. The variable capacitance circuit 200 includes a reactive element 210, a capacitor unit 220, and a bias circuit 240. The capacitor unit 220 includes MOS transistors 231 to 233 and resistive elements 221 to 227. As the MOS transistors 231 to 233, for example, N-type MOS transistors are used.

The reactive element 210 is connected to the capacitor unit 220 in series between the resistive element 121 and a ground terminal. Further, the node between the reactive element 210 and the capacitor unit 220 is connected to the antenna radiator 110.

The capacitor unit 220 has an input terminal IN and an output terminal OUT. The input terminal IN is connected to the reactive element 210 and the antenna radiator 110. The output terminal OUT is connected to the ground terminal.

The reactive element 210 is an element having a fixed reactance value and is, for example, an inductive reactive element such as an inductor. Note that, instead of the inductive reactive element, a capacitive reactive element such as a capacitor can be used as the reactive element 210.

The MOS transistors 231 to 233 are connected in series between the input terminal IN and the output terminal OUT. Further, the resistive element 221 is connected to the MOS transistor 231 in parallel, and the resistive element 222 is connected to the MOS transistor 232 in parallel. The resistive element 223 is connected to the MOS transistor 233 in parallel.

The resistive element 224 is inserted between the gate of the MOS transistor 231 and the bias circuit 240, and the resistive element 225 is inserted between the gate of the MOS transistor 232 and the bias circuit 240. The resistive element 226 is inserted between the gate of the MOS transistor 233 and the bias circuit 240. The resistive element 227 is inserted between the source of the MOS transistor 233 and the ground terminal.

The MOS transistors 231 to 233 each have a capacitance value based on bias voltages. The MOS transistor 231 is turned on when receiving an on voltage for turning on the MOS transistor 231 at the gate as a bias voltage. For example, a high-level voltage higher than the threshold voltage of the MOS transistor 231 is applied as the on voltage.

Meanwhile, the MOS transistor 231 is turned off when receiving an off voltage for turning off the MOS transistor 231 at the gate. For example, a low-level voltage equal to or lower than the threshold voltage of the MOS transistor 231 is applied as the off voltage. The capacitance of the MOS transistor 231 in the off state depends on the gate width or the off voltage. Meanwhile, the capacitance of the MOS transistor 231 in the on state is significantly smaller than that of the MOS transistor 231 in the off state and is close to "0" farad (F). In the following, the capacitance of the MOS transistor 231 in the off state is referred to as an "off capacitance." The same holds true for the MOS transistors 232 and 233. Note that, the MOS transistors 231 to 233 are each an example of a semiconductor element described in Claims.

The bias circuit 240 applies, according to a control signal, bias voltages to the respective MOS transistors 231 to 233. The bias circuit 240 individually controls the MOS transistors 231, 232, and 233 to enter any of the on state and the off state with bias voltages. Depending on the number of MOS transistors in the off state, the combined capacitance of the capacitor unit 220 changes.

Note that, the number of MOS transistors is three, but the number of MOS transistors is not limited to three. Further, all of the MOS transistors 231 to 233 are the N-type MOS transistors, but the MOS transistors 231 to 233 may be P-type MOS transistors instead of the N-type MOS transistors. In a case where the P-type MOS transistors are used, a low-level voltage is applied as the on voltage, and a high-level voltage is applied as the off voltage.

Figure 3:
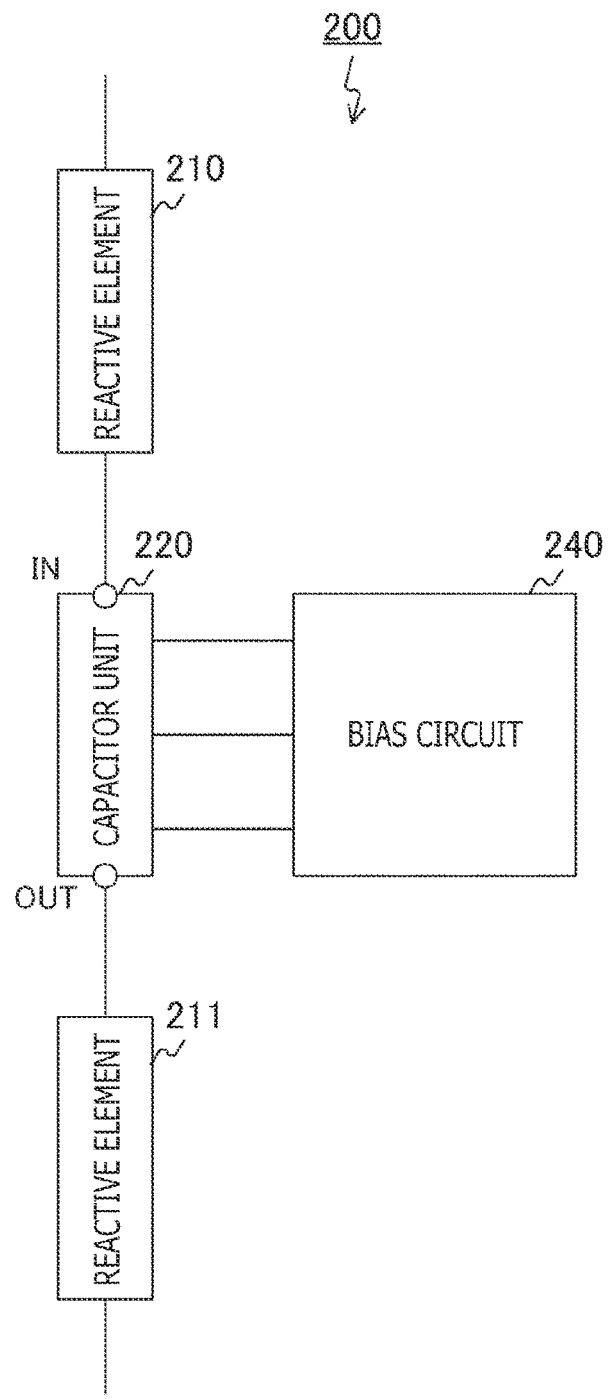
FIG. 3 is a circuit diagram illustrating a configuration example of the variable capacitance circuit having reactive elements added thereto according to the first embodiment of the present technology.

Note that, in the variable capacitance circuit 200, only the reactive element 210 is connected to the capacitor unit 220, but as exemplified in FIG. 3, a reactive element 211 can further be connected to the output terminal OUT.

Figure 4:
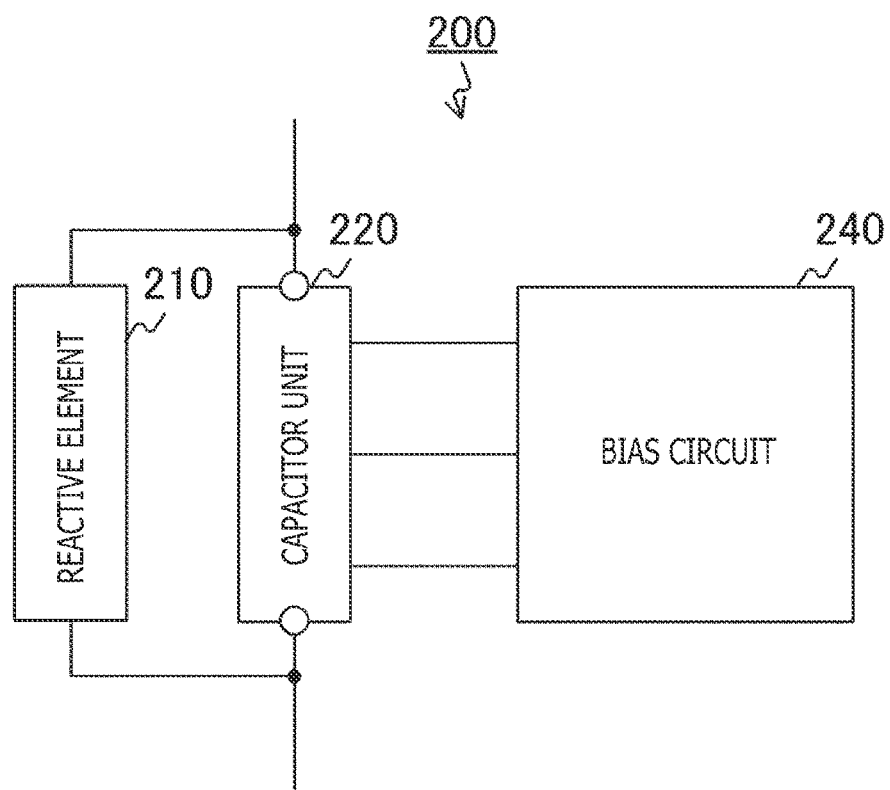
FIG. 4 is a circuit diagram illustrating a configuration example of the variable capacitance circuit including the reactive element connected in parallel according to the first embodiment of the present technology.

Further, the reactive element 210 is connected to the capacitor unit 220 in series, but the reactive element 210 can also be connected to the capacitor unit 220 in parallel, as exemplified in FIG. 4.

[Configuration Example of MOS Transistor]

FIG. 5 illustrates examples of plan views of the MOS transistor 231 according to the first embodiment of the present technology. In FIG. 5, a is a plan view of the MOS transistor 231 in a case where the gate electrode has a meander or comb shape, and b is a plan view of the MOS transistor 231 in a case where the gate electrode has a linear shape.

With the meander (or comb-shaped) structure, the MOS transistor 231 has a drain electrode 311 and a source electrode 313 that have a plurality of protruding fingers including a finger 314. The fingers of the drain electrode 311 and the fingers of the source electrode 313 are alternately disposed, and a gate electrode 312 is disposed between those fingers. In this meander (or comb-shaped) structure, each finger has parasitic resistance and parasitic inductance, so that there is a possibility that a longer finger has larger parasitic inductance and parasitic resistance.

Meanwhile, in the straight structure with the linear shape, neither the drain electrode 311 nor the source electrode 313 has fingers, so that the parasitic inductance is smaller than that in the meander (or comb-shaped) structure. Thus, a transistor having the straight structure is desirably used as the MOS transistor 231. The same holds true for the MOS transistors 232 and 233.

Figure 6:
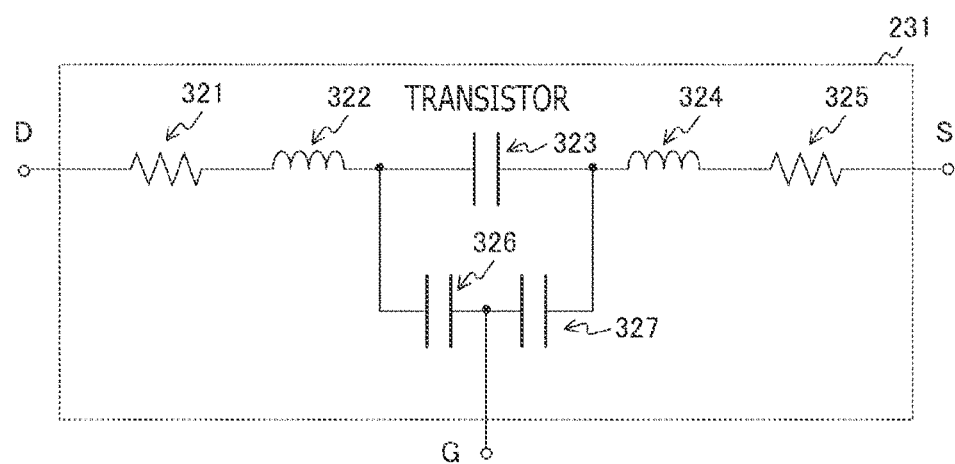
FIG. 6 is a circuit diagram illustrating an example of an equivalent circuit of the MOS transistor according to the first embodiment of the present technology.

FIG. 6 is a circuit diagram illustrating an example of an equivalent circuit of the MOS transistor 231. This equivalent circuit includes parasitic resistances 321 and 325, parasitic inductances 322 and 324, a drain-source capacitance 323, a gate-drain capacitance 326, and a gate-source capacitance 327. The parasitic resistances 321 and 325 and the parasitic inductances 322 and 324 have larger values with longer fingers in the meander (or comb-shaped) structure.

Figure 7:
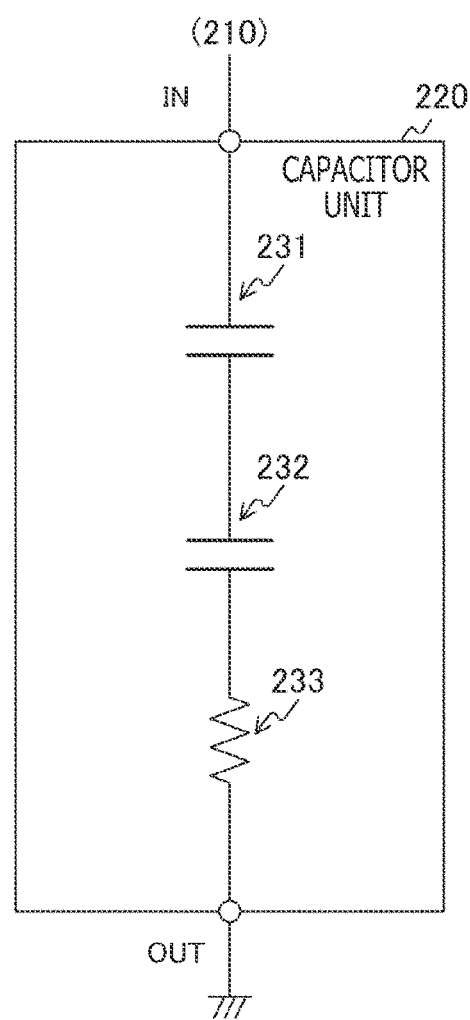
FIG. 7 is an example of an equivalent circuit of a capacitor unit according to the first embodiment of the present technology.

FIG. 7 is an example of an equivalent circuit of the capacitor unit 220 according to the first embodiment of the present technology. In a case where the MOS transistors 231 and 232 are turned off, and the MOS transistor 233 is turned on, the MOS transistors 231 and 232 each have off capacitance, and the MOS transistor 233 has on resistance.

FIG. 8 is a diagram illustrating an example of combined capacitance control according to the first embodiment of the present technology. The bias circuit 240 receives a 3-bit control signal. The 0-th bit of this control signal is associated with the MOS transistor 231, and the first bit thereof is associated with the MOS transistor 232. The second bit of the control signal is associated with the MOS transistor 233. For example, the bias circuit 240 supplies the on voltage to MOS transistors corresponding to a bit value "1," and supplies the off voltage to MOS transistors corresponding to a bit value "0."

In a case where the control signal has a binary number "000," the MOS transistors 231 to 233 are all turned off, for example. When the off capacitance of each of the MOS transistors 231 to 233 is denoted by $C_{off}$, the combined capacitance of the capacitor unit 220 is $C_{off}/3$.

In a case where any of the bits of the control signal is "1" and the remaining are "0," any of the MOS transistors 231 to 233 is turned on, and the remaining two are turned off. The combined capacitance at this time is $C_{off}/2$.

In a case where any of the bits of the control signal is "0" and the remaining are "1," any of the MOS transistors 231 to 233 is turned off, and the remaining two are turned on. The combined capacitance at this time is $C_{off}$.

As described above, the bias circuit 240 can change the combined capacitance of the capacitor unit 220 by controlling the number of MOS transistors in the off state.

Figure 9:
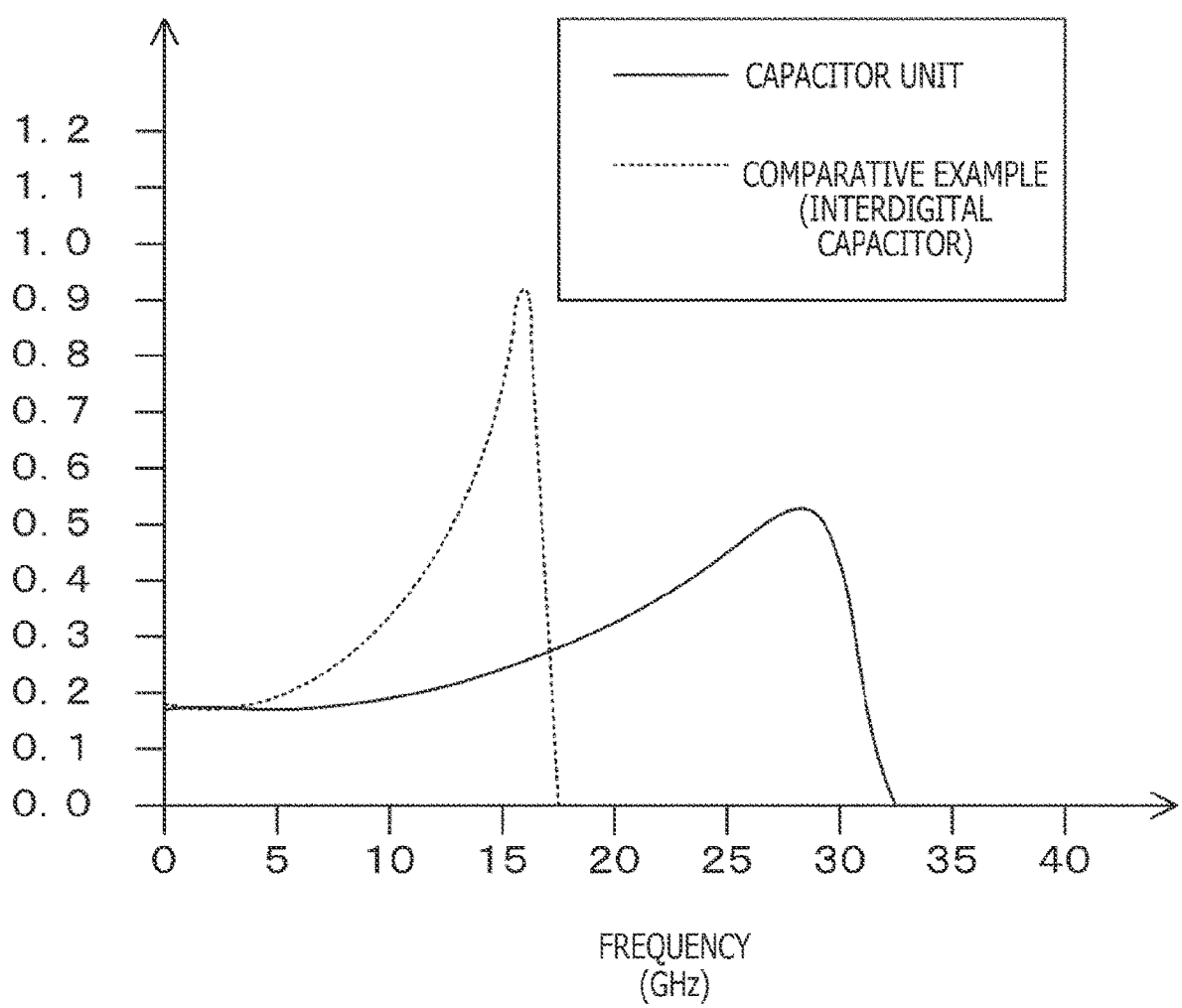
FIG. 9 is a graph illustrating examples of frequency characteristics of the first embodiment of the present technology and a comparative example.

FIG. 9 is a graph illustrating examples of frequency characteristics of the first embodiment of the present technology and a comparative example. In FIG. 9, the vertical axis represents the capacitance value of the capacitor unit 220, and the horizontal axis represents the frequency of a wireless signal.

Here, a variable capacitor of the comparative example in which plural capacitors each having fixed capacitance are connected in series, and the capacitors are connected to respective switches in parallel is assumed. In a case where capacitors are mounted on a semiconductor substrate together with switches, MIM (Metal-Insulator-Metal) capacitors or interdigital capacitors, which are described above, are generally used. A MIM capacitor is a capacitor in which an insulator that is a dielectric is inserted between metal components.

A MIM capacitor having a smaller capacitance value has larger manufacturing variations. Thus, interdigital capacitors are used in a case where a relatively small capacitance value is needed. However, an interdigital capacitor has parasitic inductance in wiring that increases with a longer wiring, with the result that the self-resonant frequency at which the capacitance value is maximum drops. The dashed curve of FIG. 9 indicates the frequency characteristic of the comparative example using the interdigital capacitors. As exemplified in FIG. 9, the self-resonant frequency of the comparative example is approximately 17 gigahertz (GHz).

In contrast to this, in the capacitor unit 220 using the off capacitance of the MOS transistor 231 and the like, the self-resonant frequency is higher than that of the comparative example and is approximately 30 gigahertz (GHz). This is because the drain-source distance of the MOS transistor is shorter than the inter-wire distance of an interdigital capacitor so that a high capacitive characteristic is obtained, and the metal formed portions of the drain and the source are small so that small parasitic inductance and parasitic resistance can be achieved. This is due to the fact that the MOS transistors are formed by using a transistor formation process, and can thus be miniaturized as compared to interdigital capacitors. The solid curve of FIG. 9 indicates the frequency characteristic of the capacitor unit 220.

Further, using the MOS transistors has an advantage over using interdigital capacitors in that the variable capacitance circuit 200 can easily be downsized.

Further, with the use of the miniaturized MOS transistors manufactured through the process, the variable capacitance circuit 200 having significantly low capacitance and a small capacitive deflection can be achieved.

Further, with the use of the MOS transistors, the circuit can be downsized to achieve small parasitic capacitance. With this, an increase in variable capacitance width and a cost reduction can be achieved.

In addition, as a MIM capacitor or an interdigital capacitor is downsized or the capacitance of the MIM capacitor or the interdigital is increased, the insulating layer of the capacitor is thinned, and the gaps between the wires are inevitably narrowed. Thus, it is difficult to increase the electrostatic discharge (ESD) resistance. To enhance the ESD resistance, an ESD protection circuit needs to be connected to the capacitor in parallel, but when the ESD protection circuit is connected, the characteristics of the capacitor such as variable capacitance width and loss are affected. In contrast to this, in the variable capacitance circuit 200 using the off capacitance of the MOS transistors, the MOS transistors have effects similar to that of an ESD protection circuit, so that the characteristics such as variable capacitor width and loss can kept favorable without separately providing an ESD protection circuit.

Further, in the comparative example, the off capacitance of the switch connected to the interdigital capacitor in parallel is limited depending on the balance with the capacitance value of the capacitor. In a case where the switch is a transistor, the gate width is limited due to the limitation on the off capacitance, and the on resistance value is also affected by the limitation on the gate width.

In such a way, according to the first embodiment of the present technology, the bias circuit 240 turns on or off each of the MOS transistors 231 to 233 connected in series with bias voltages, to thereby control the capacitance values. Thus, a self-resonant frequency higher than that in the case where interdigital capacitors, which have a larger parasitic inductance than the MOS transistor 231 and the like, are used can be achieved.

2. Second Embodiment

In the first embodiment described above, the bias circuit 240 turns on or off each MOS transistor such as the MOS transistor 231 to control the capacitance values to "0" farad (F) or the off capacitance $C_{off}$. In other words, the bias circuit 240 controls the capacitance value of each MOS transistor in the two stages. However, with two-stage control, there is a possibility that the fine adjustment of the combined capacitance is difficult. The bias circuit 240 of a second embodiment is different from the first embodiment in that the bias circuit 240 controls the capacitance value of each MOS transistor in three or more stages.

Figure 10:
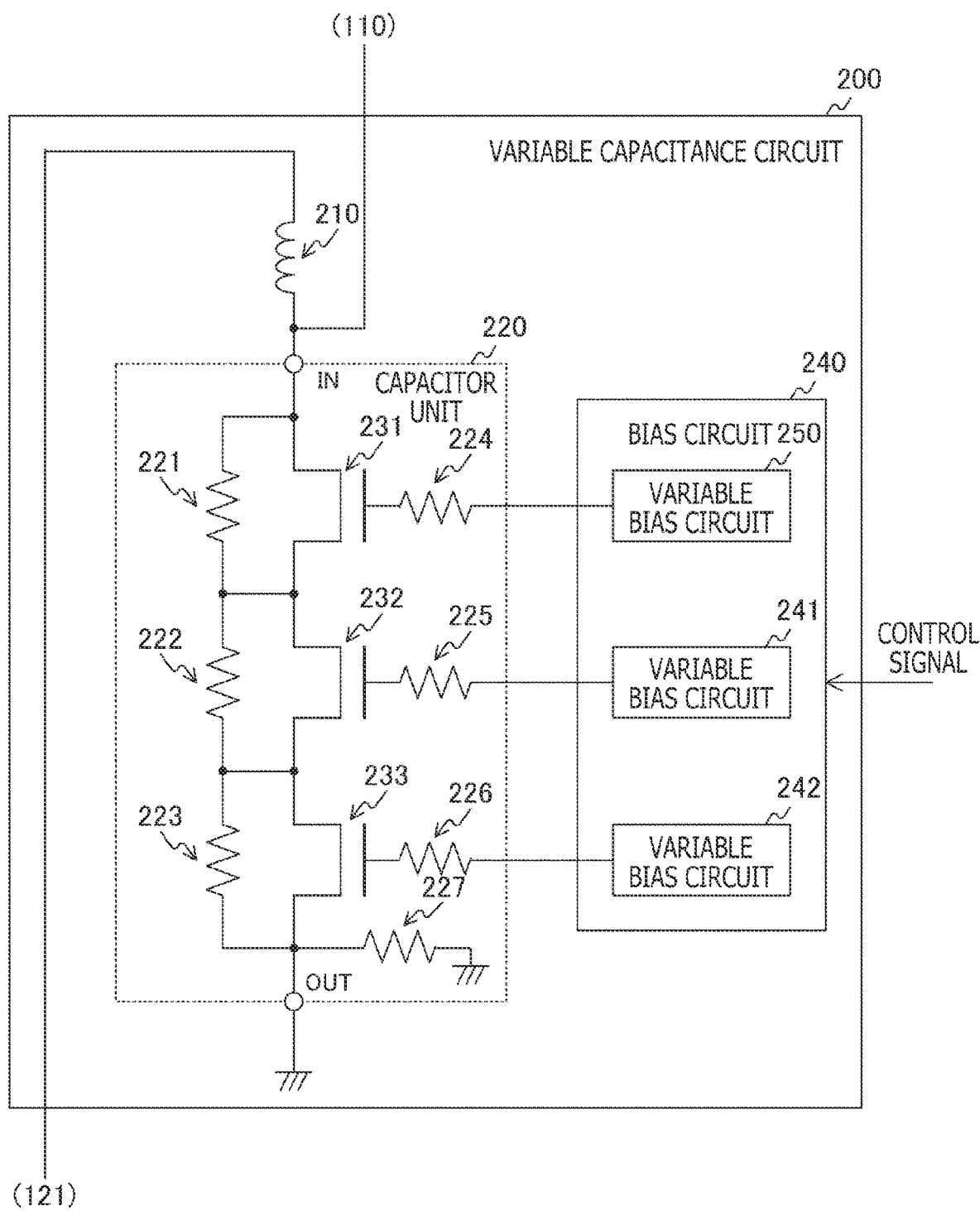
FIG. 10 is a circuit diagram illustrating a configuration example of a variable capacitance circuit according to a second embodiment of the present technology.

FIG. 10 is a circuit diagram illustrating a configuration example of the variable capacitance circuit 200 according to the second embodiment of the present technology. The variable capacitance circuit 200 of the second embodiment is different from the first embodiment in that the bias circuit 240 has disposed therein variable bias circuits 250, 241, and 242.

The variable bias circuit 250 supplies, according to a control signal, any of a high bias voltage higher than the threshold voltage (on voltage) and plural bias voltages (off voltage) to the MOS transistor 231, the plural bias voltages being different from each other and equal to or lower than the threshold voltage. The variable bias circuits 241 and 242 are configured like the variable bias circuit 250 except that the variable bias circuits 241 and 242 apply bias voltages to the MOS transistors 232 and 233.

Figure 11:
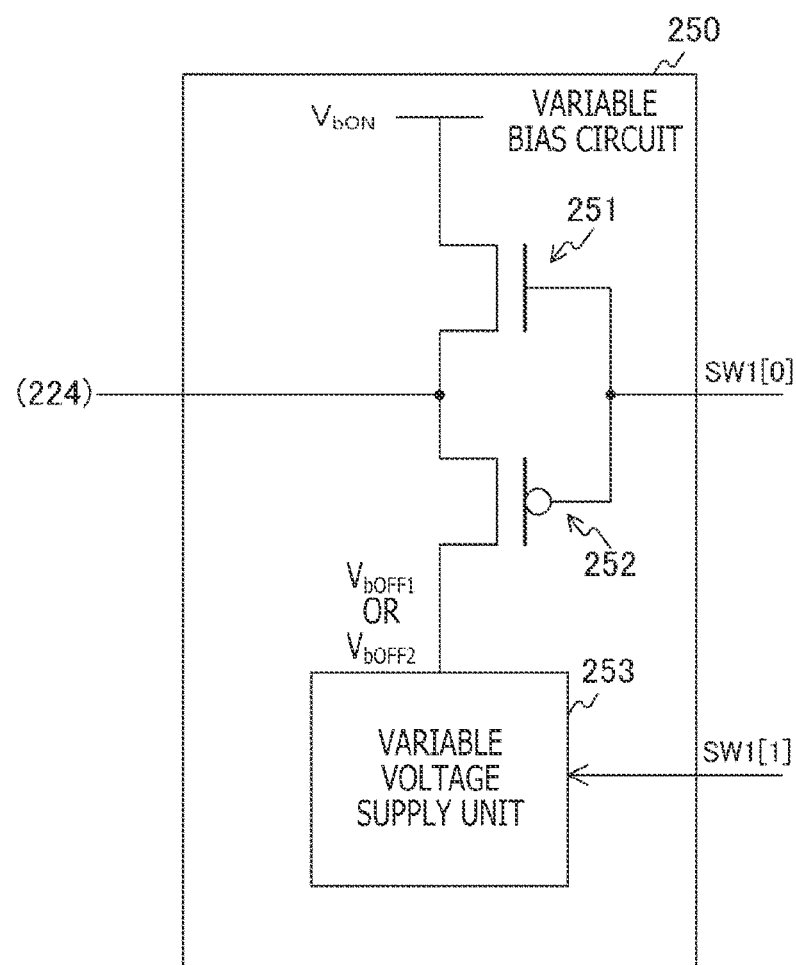
FIG. 11 is a circuit diagram illustrating a configuration example of a variable bias circuit according to the second embodiment of the present technology.

FIG. 11 is a circuit diagram illustrating a configuration example of the variable bias circuit 250 according to the second embodiment of the present technology. The variable bias circuit 250 includes an nMOS (n-Channel MOS) transistor 251, a pMOS (p-Channel MOS) transistor 252, and a variable voltage supply unit 253. The nMOS transistor 251 and the pMOS transistor 252 are connected in series between a terminal at an on voltage $V_{bON}$ and the variable voltage supply unit 253. The node between the nMOS transistor 251 and the pMOS transistor 252 is connected to the MOS transistor 231 through the resistive element 224.

Here, in the second embodiment, there are control signals SW1, SW2, and SW3. The control signal SW1 is a 2-bit signal and input to the variable bias circuit 250. The control signal SW2 is also a 2-bit signal and inputs to the variable bias circuit 241. The control signal SW3 is also a 2-bit signal and inputs to the variable bias circuit 242.

The 0-th bit of the control signal SW1 is input to the gates of the nMOS transistor 251 and the pMOS transistor 252 in common. The first bit of the control signal SW1 is input to the variable voltage supply unit 253.

The variable voltage supply unit 253 applies, depending on the first bit of the control signal SW1, any of off voltages $V_{bOFF1}$ and $V_{bOFF2}$ different from each other to the drain of the pMOS transistor 252.

Figures 12, 13:
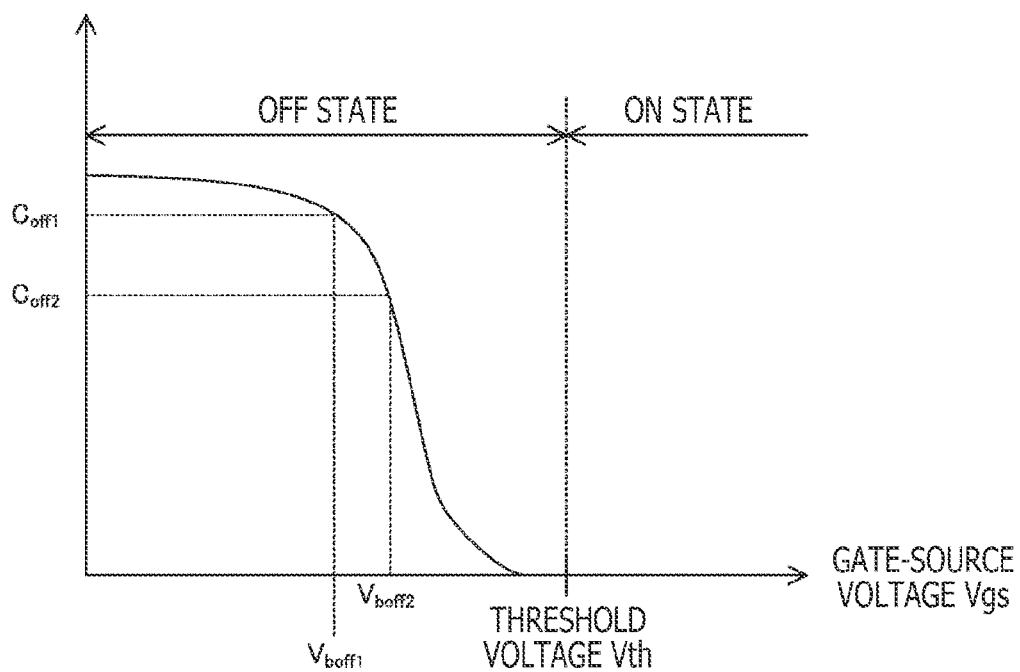
FIG. 12 is a diagram illustrating an example of a relation between a gate-source voltage and an off capacitance of a MOS transistor according to the second embodiment of the present technology.
FIG. 13 is a diagram illustrating an example of control of the MOS transistor according to the second embodiment of the present technology.

FIG. 12 is a diagram illustrating an example of a relation between the gate-source voltage and off capacitance of the MOS transistor 231 according to the second embodiment of the present technology. In FIG. 12, the vertical axis represents the capacitance value of the off capacitance, and the horizontal axis represents a gate-source voltage Vgs (in other words, bias voltage). As exemplified in FIG. 12, in the off state where the gate-source voltage Vgs (bias voltage) is equal to or lower than the threshold voltage, the MOS transistor has a larger off capacitance value with a lower bias voltage.

For example, the MOS transistor 231 is turned off when receiving the off voltage $V_{bOFF1}$ equal to or lower than the threshold voltage, and the off capacitance thereof is $C_{off1}$. Further, the MOS transistor 231 is turned off when receiving the off voltage $V_{bOFF2}$ equal to or lower than the threshold voltage and higher than the off voltage $V_{bOFF1}$, and the off capacitance thereof is $C_{off2}$ smaller than $C_{off1}$. The capacitance values of the MOS transistor 231 and the like can individually be adjusted in such a way, so that manufacturing variation reduction and capacitance value calibration can be facilitated.

Note that, the bias circuit 240 controls the off voltage in the two stages, namely, $V_{bOFF1}$ and $V_{bOFF2}$, but the bias circuit 240 can also control the off voltage in three or more stages.

FIG. 13 is a diagram illustrating an example of the control of the MOS transistor 231 according to the second embodiment of the present technology.

In a case where the control signal SW1 has a binary number "10," the MOS transistor 231 is turned on, and the capacitance value thereof is approximately "0" farad (F). Further, in a case where the control signal SW1 has a binary number "01," the MOS transistor 231 is turned off and the capacitance value thereof is $C_{off1}$. In a case where the control signal SW1 has a binary number "00," the MOS transistor 231 is turned off and the capacitance value thereof is $C_{off2}$.

In such a way, according to the second embodiment of the present technology, the bias circuit 240 controls the capacitance values of the MOS transistors 231 to 233 in the three stages, so that the combined capacitance can be adjusted more finely than in the first embodiment employing two-stage control.

3. Third Embodiment

In the first embodiment described above, the MOS transistors 231 to 233 have the same off capacitance value, but in this configuration, there is a possibility that the fine adjustment of the combined capacitance is difficult. The variable capacitance circuit 200 of a third embodiment is different from the first embodiment in that the MOS transistors 231 to 233 have different capacitance values.

FIG. 14 is a diagram illustrating an example of a gate width of each MOS transistor according to the third embodiment of the present technology. A gate width of the MO transistor 231 is denoted by Wg1, and the off capacitance thereof is denoted by $C_{off}$.

A gate width of the MOS transistor 232, which is denoted by Wg2, is set to ½ of Wg1, for example. Since off capacitance is proportional to a gate width when a bias voltage is constant, the off capacitance of the MOS transistor 232 is $C_{off}/2$. Further, a gate width of the MOS transistor 233, which is denoted by Wg3, is set to ¼ of Wg1, for example. With this, the off capacitance of the MOS transistor 233 is $C_{off}/4$.

Here, it is assumed that a signal voltage across the input terminal IN and the output terminal OUT does not exceed the withstand voltage of the MOS transistor on the single stage. If the signal voltage exceeds the withstand voltage of the MOS transistor on the single stage, it is sufficient to increase the number of stages of MOS transistors depending on their withstand voltages and to adjust their gate widths. For example, the MOS transistor 231 is replaced by transistors on two stages, and the gate width of the transistor on each stage is set to Wg1×2. With this, those transistors have an off capacitance of 2×$C_{off}$ which is a desired value. The same holds true for the MOS transistors 232 and 233.

Note that, the MOS transistors 231 to 233 have the gate width values different from each other, but two of the MOS transistors 231 to 233 can have the same gate width value, while the remaining one has a gate width different from that of the other two.

FIG. 15 is a diagram illustrating an example of combined capacitance control according to the third embodiment of the present technology. In the case where the control signal has the binary number "000," the MOS transistors 231 to 233 are all turned off and the combined capacitance thereof is $C_{off}/7$.

In a case where the control signal has "001," only the MOS transistors 231 and 232 are turned off and the combined capacitance thereof is $C_{off}/3$. In a case where the control signal has "100," only the MOS transistors 232 and 233 are turned off, and the combined capacitance thereof is $C_{off}/6$. In a case where the control signal has "010," only the MOS transistors 231 and 233 are turned off, and the combined capacitance thereof is $C_{off}/5$.

In a case where the control signal has "011," only the MOS transistor 231 is turned off, and the capacitance of the capacitor unit 220 is $C_{off}$. In a case where the control signal has "101," only the MOS transistor 232 is turned off, and the capacitance of the capacitor unit 220 is $C_{off}/2$. In a case where the control signal has "110," only the MOS transistor 233 is turned off, and the capacitance of the capacitor unit 220 is $C_{off}/4$.

Note that, in the third embodiment, the capacitance value of each of the MOS transistors 231 to 233 can also be controlled in three or more stages as in the second embodiment.

In such a way, according to the third embodiment of the present technology, the MOS transistors 231 to 233 have the different gate widths, so that the bias circuit 240 can control the transistors to different off capacitance values through off voltage application. With this, the bias circuit 240 can adjust the combined capacitance more finely than in the first embodiment in which the MOS transistors 231 to 233 have the same off capacitance.

4. Fourth Embodiment

In the first embodiment described above, the plural MOS transistors are connected in series, but in this configuration, there is a possibility that the fine adjustment of the combined capacitance is difficult. The variable capacitance circuit 200 of a fourth embodiment is different from the first embodiment in that plural circuits each having disposed therein a group of MOS transistors connected in series are connected in parallel.

Figure 16:
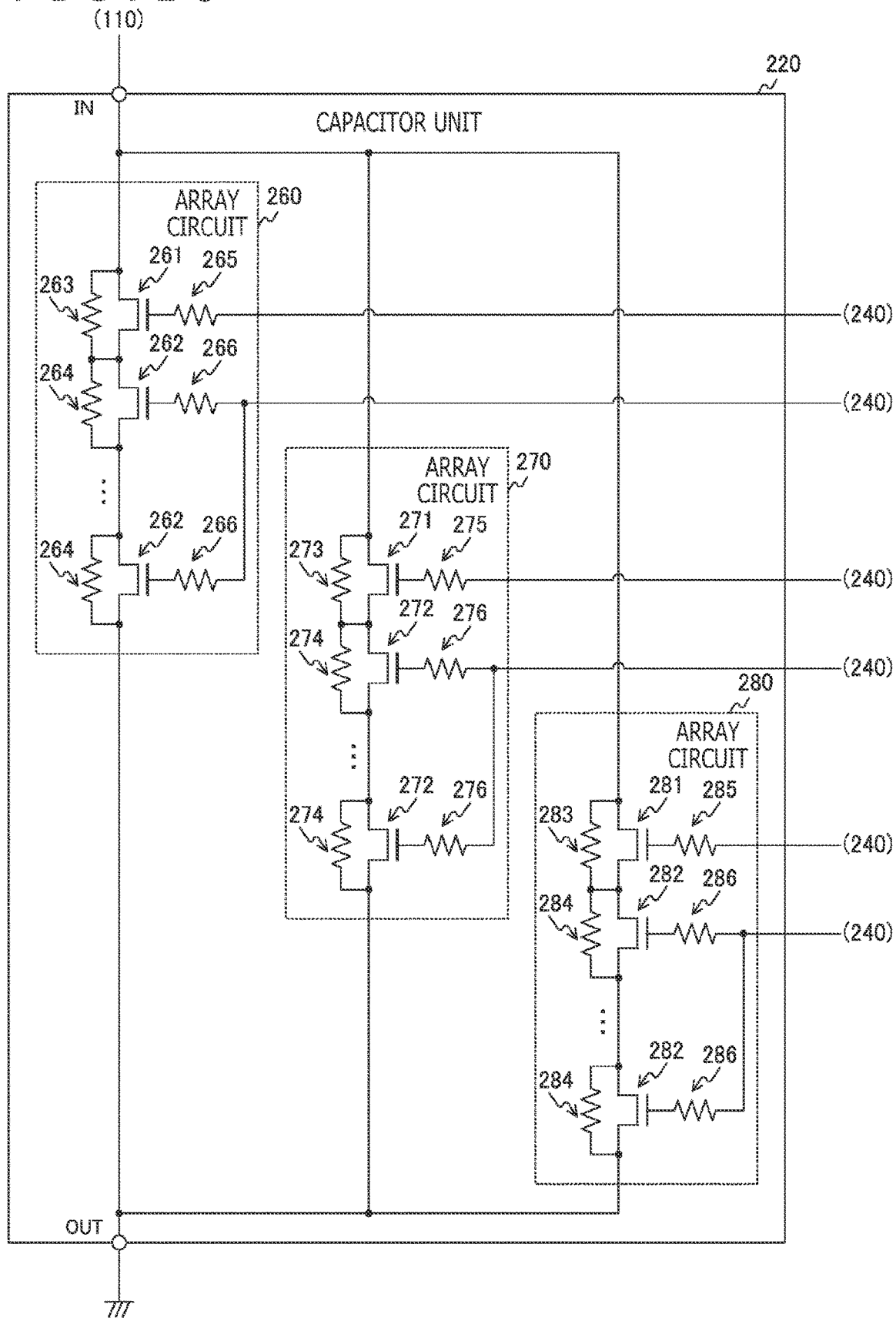
FIG. 16 is a circuit diagram illustrating a configuration example of a capacitor unit according to a fourth embodiment of the present technology.

FIG. 16 is a circuit diagram illustrating a configuration example of the capacitor unit 220 according to the fourth embodiment of the present technology. The capacitor unit 220 of the fourth embodiment includes array circuits 260, 270, and 280. The array circuit 260 includes a MOS transistor 261, N (N is an integer) MOS transistors 262, a resistive element 263, N resistive elements 264, a resistive element 265, and N resistive elements 266. As the MOS transistor 261 and the N MOS transistors 262, N-type transistors are used.

The MOS transistor 261 and the N MOS transistors 262 are connected in series between the input terminal IN and the output terminal OUT. The resistive element 263 is connected to the MOS transistor 261 in parallel. The n (n is an integer of from 1 to N)-th resistive element 264 is connected to the n-th MOS transistor 262 in parallel. The resistive element 265 is inserted between the gate of the MOS transistor 261 and the bias circuit 240. The N resistive elements 266 have one ends connected to the gates of the respective MOS transistors 262, and the other ends connected to the bias circuit 240 in common.

The array circuit 270 includes a MOS transistor 271, N MOS transistors 272, a resistive element 273, N resistive elements 274, a resistive element 275, and N resistive elements 276. As the MOS transistor 271 and the N MOS transistors 272, N-type transistors are used.

The array circuit 280 includes a MOS transistor 281, N MOS transistors 282, a resistive element 283, N resistive elements 284, a resistive element 285, and N resistive elements 286. As the MOS transistor 281 and the N MOS transistors 282, N-type transistors are used. The number of stages (N) of MOS transistors and the gate widths thereof are determined in consideration of, for example, the withstand voltages of the MOS transistors, a required Q value of the variable capacitance circuit 200, or set combined capacitance with the MOS transistors all in the off state.

The element connection configurations in the circuits of the array circuits 270 and 280 are similar to that of the array circuit 260. Further, the array circuits 260, 270, and 280 are connected in parallel between the input terminal IN and the output terminal OUT.

Note that, the three array circuits are connected in parallel, but the number of array circuits connected in parallel is not limited to three. Further, the array circuits 260, 270, and 280 include the same number of MOS transistors, but the array circuits 260, 270, and 280 may include different numbers of MOS transistors.

FIG. 17 is a diagram illustrating an example of combined capacitance control according to the fourth embodiment of the present technology. The bias circuit 240 of the fourth embodiment receives a 6-bit control signal. The 0-th bit of this control signal is associated with the MOS transistor 261, and the first bit thereof is associated with the MOS transistor 271. The second bit of the control signal is associated with the MOS transistor 281. Further, the third bit of the control signal is associated with the N MOS transistors 262, and the fourth bit thereof is associated with the N MOS transistors 272. The fifth bit of the control signal is associated with the N MOS transistors 282. Further, the off capacitance of each of the MOS transistors 261 and 262 is denoted by $C_1$, and the off capacitance of each of the MOS transistors 271 and 272 is denoted by $C_2$. The off capacitance of each of the MOS transistors 281 and 282 is denoted by $C_3$.

In a case where the control signal has a binary number "000000," the MOS transistor 261 and the like are all turned off and the combined capacitance thereof is $(C_1+C_2+C_3)/(N+1)$. In a case where the control signal has "000100," "000010," or "000001," one of the MOS transistors 262, 272, and 282 is turned on and the combined capacitance thereof is $C_1+(C_2+C_3)/(N+1)$, $C_2+(C_3+C_1)/(N+1)$, or $C_3+(C_1+C_2)/(N+1)$.

In a case where the control signal has "000110," "000011," or "000101," two of the MOS transistors 262, 272, and 282 are turned on and the combined capacitance thereof is $C_1+C_2+C_3/(N+1)$, $C_2+C_3+C_1/(N+1)$, or $C_3+C_1+C_2/(N+1)$. In a case where the control signal has "000111," the MOS transistors 262, 272, and 282 are all turned on and the combined capacitance thereof is $(C_1+C_2+C_3)$.

In a case where the control signal has "111111," the MOS transistor 261 and the like are all turned on, and the input terminal IN and the output terminal OUT are bypassed. In a case where the control signal has "001001," "100100," or "010010," the MOS transistor groups in two of the array circuits 260, 270, and 280 are turned off. In a case where the control signal has "011011," "101010," or "110110," the MOS transistor group in one of the array circuits 260, 270, and 280 is turned off.

Note that, in the fourth embodiment, the capacitance value of each of the MOS transistors 231 to 233 can also be controlled in three or more stages as in the second embodiment. Further, plural MOS transistors having different gate widths can be disposed as in the third embodiment.

In such a way, according to the fourth embodiment of the present technology, the array circuits 260, 270, and 280 each having disposed therein the group of the MOS transistors connected in series are connected in parallel, so that the combined capacitance can be adjusted more finely than in the case where only the array circuit 260 is provided.

5. Fifth Embodiment

In the first embodiment described above, the plural MOS transistors are connected in series, but those MOS transistors can also be replaced by diode pair circuits. The variable capacitance circuit 200 of a fifth embodiment is different from the first embodiment in that plural diode pair circuits are connected in series.

Figure 18:
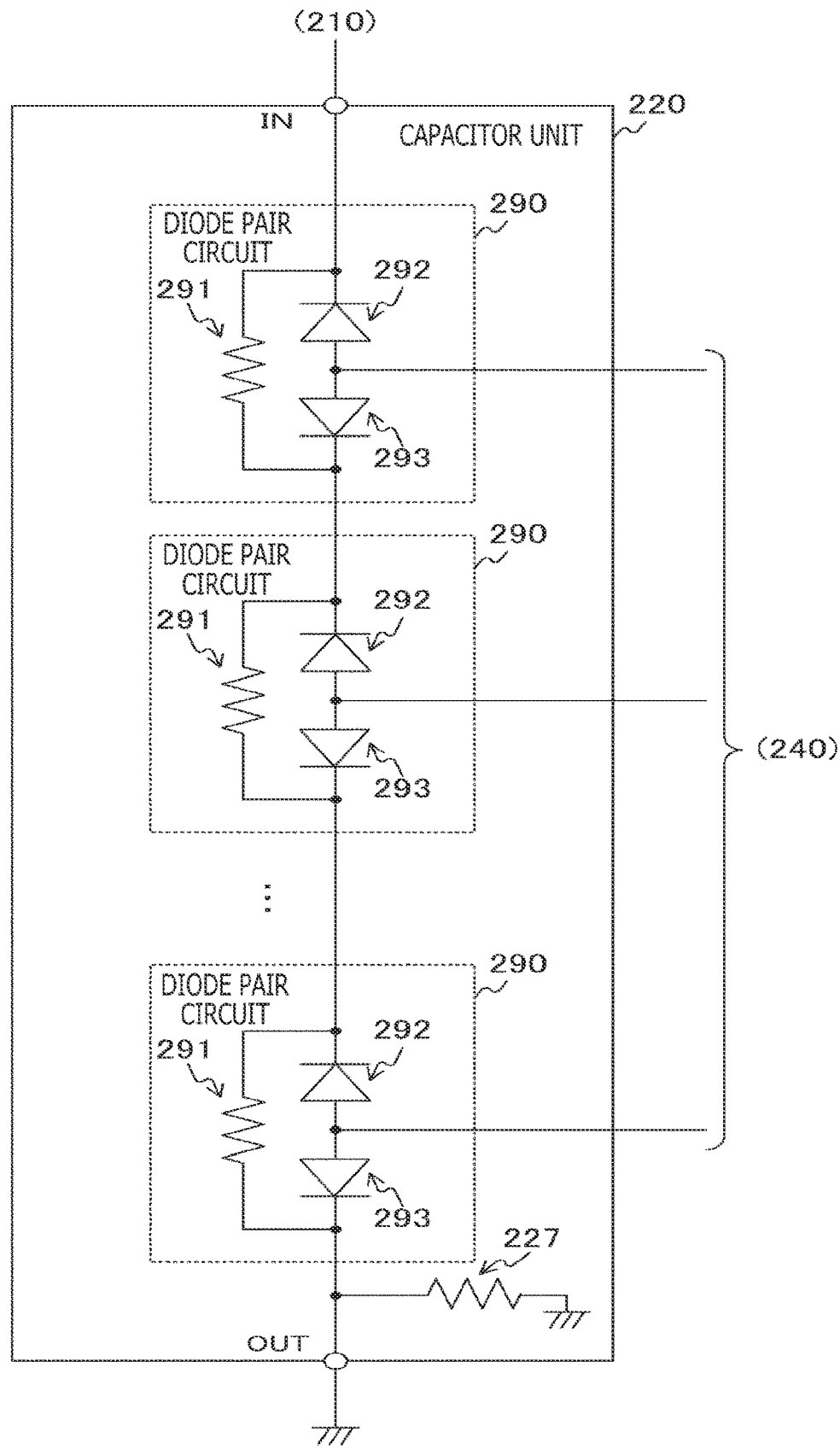
FIG. 18 is a circuit diagram illustrating a configuration example of a capacitor unit according to a fifth embodiment of the present technology.

FIG. 18 is a circuit diagram illustrating a configuration example of the capacitor unit 220 according to the fifth embodiment of the present technology. The capacitor unit 220 includes plural diode pair circuits 290 and the resistive element 227. The diode pair circuits 290 are connected in series between the input terminal IN and the output terminal OUT. The diode pair circuits 290 each include a resistive element 291 and diodes 292 and 293.

The diode 292 has an anode connected to the anode of the diode 293. The node between the anodes of the diodes 292 and 293 is connected to the bias circuit 240. Further, the resistive element 291 has one end connected to the cathode of the diode 292, and the other end connected to the cathode of the diode 293. Further, the resistive element 227 is inserted between the cathode of any of the diodes 293 and the ground terminal.

The bias circuit 240 individually applies bias voltages to the respective diode pair circuits 290. The bias circuit 240 applies, for example, one of an anode potential $V_{AH}$ higher than a cathode potential $V_K$ of each of the diodes 292 and 293, and an anode potential $V_{AL}$ lower than the cathode potential $V_K$. Since the cathodes are placed through the resistive element 227, the cathode potential $V_K$ is the ground potential, for example.

FIG. 19 illustrates examples of equivalent circuits of the diode pair circuit 290 according to the fifth embodiment of the present technology. Here, a of FIG. 19 is an example of the equivalent circuit of the diode pair circuit 290 in a case where the anode potential $V_{AL}$ lower than the cathode potential $V_K$ is applied. Further, b of FIG. 19 is an example of the equivalent circuit of the diode pair circuit 290 in a case where the anode potential $V_{AH}$ higher than the cathode potential $V_K$ is applied.

In the case where the bias circuit 240 applies the anode potential $V_{AL}$ lower than the cathode potential $V_K$, a backward voltage is applied between the cathode and anode of each of the diodes 292 and 293. Thus, in each of the diodes 292 and 293, capacitance values based on the backward voltage are generated.

Meanwhile, in the case where the bias circuit 240 applies the high anode potential $V_{AH}$ higher than the cathode potential $V_K$, a forward voltage is applied between the cathode and anode of each of the diodes 292 and 293. Thus, the resistance value of each of the diodes 292 and 293 is a constant value. Further, the parasitic inductance values of the diodes 292 and 293 are lower than those of interdigital capacitors. Thus, with the use of the diode pair circuits 290, the self-resonant frequency of the variable capacitance circuit 200 can be higher than that in the case where interdigital capacitors are used.

Note that, in the fifth embodiment, the capacitance value of each of the diodes can also be controlled in three or more stages as in the second embodiment. Further, as in the fourth embodiment, the array circuit 260 and the like can be connected in parallel and each array circuit can have disposed therein the plural diode pair circuits 290 connected in series.

In such a way, according to the fifth embodiment of the present technology, the bias circuit 240 applies a forward voltage or a backward voltage to each of the plural diode pair circuits 290 connected in series, to thereby control the capacitance values. Thus, a self-resonant frequency higher than that in the case where interdigital capacitors, which have a larger parasitic inductance than the diodes, are used can be achieved.

6. Sixth Embodiment

In the first embodiment described above, the capacitor unit 220 is disposed in the impedance matching circuit 120, but the capacitor unit 220 can also be disposed in an antenna tuning circuit. The wireless communication device 100 of a sixth embodiment is different from the first embodiment in that the capacitor unit 220 is disposed in an antenna tuning circuit.

Figure 20:
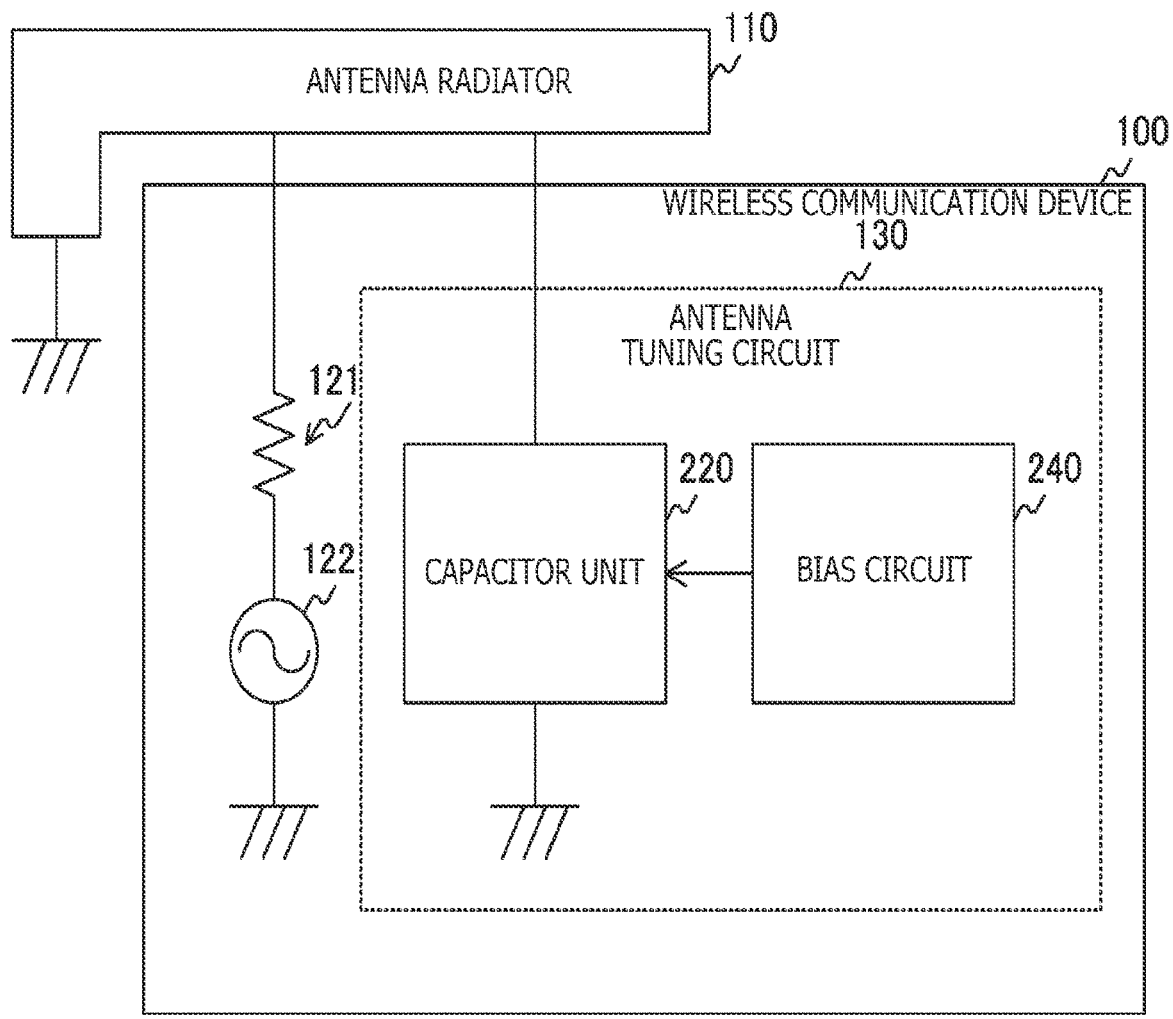
FIG. 20 is a circuit diagram illustrating a configuration example of a wireless communication device according to a sixth embodiment of the present technology.

FIG. 20 is a circuit diagram illustrating a configuration example of the wireless communication device 100 according to the sixth embodiment of the present technology. The wireless communication device 100 of the sixth embodiment is different from the first embodiment in that the wireless communication device 100 includes, instead of the impedance matching circuit 120, an antenna tuning circuit 130 for adjusting the resonant frequency of the antenna radiator.

The antenna tuning circuit 130 includes the capacitor unit 220 and the bias circuit 240. The resistive element 121 and the signal source 122 are connected to the antenna radiator 110 in series through an impedance matching circuit (not illustrated). Further, the capacitor unit 220 has one end connected to the antenna radiator 110, and the other end grounded. Since the antenna radiator 110 has a reactive component, the antenna radiator 110, the capacitor unit 220, and the bias circuit 240 form the variable capacitance circuit 200. Note that, the antenna radiator 110 is an example of a reactive element described in Claims.

In such a way, according to the sixth embodiment of the present technology, the capacitor unit 220 is disposed in the antenna tuning circuit 130, so that the antenna resonant frequency of the wireless communication device 100 configured to receive high frequency wireless signals can be adjusted.

7. Seventh Embodiment

The variable capacitance circuit 200 can also be disposed in an antenna matching circuit. The wireless communication device 100 of a seventh embodiment is different from the first embodiment in that the variable capacitance circuit 200 is disposed in an antenna matching circuit.

Figure 21:
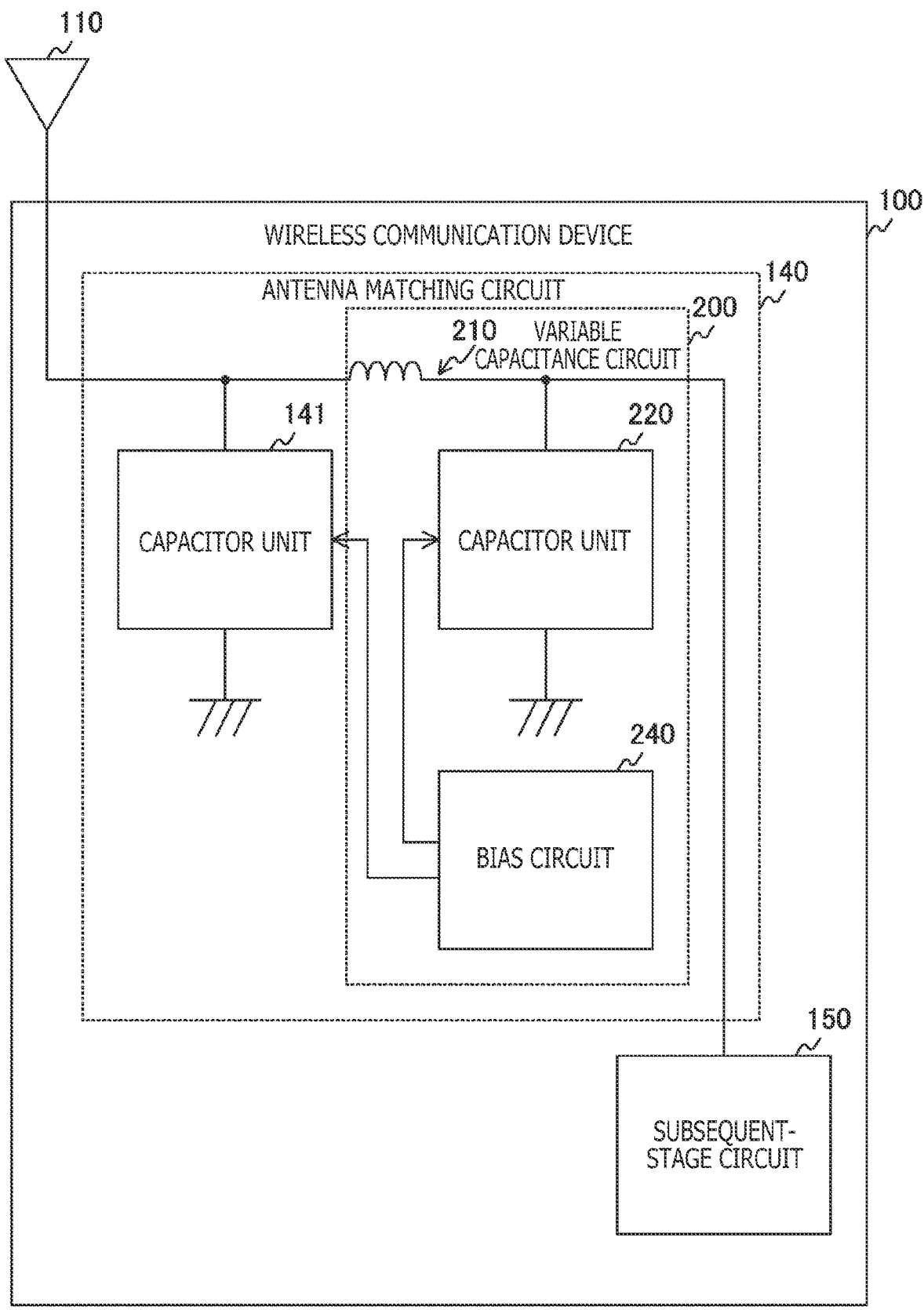
FIG. 21 is a circuit diagram illustrating a configuration example of a wireless communication device according to a seventh embodiment of the present technology.

FIG. 21 is a circuit diagram illustrating a configuration example of the wireless communication device 100 according to the seventh embodiment of the present technology. The wireless communication device 100 of the seventh embodiment includes an antenna matching circuit 140 and a subsequent-stage circuit 150.

The antenna matching circuit 140 includes the reactive element 210, capacitor units 141 and 220, and the bias circuit 240. The reactive element 210 is inserted between the antenna radiator 110 and the subsequent-stage circuit 150. The capacitor unit 141 is connected to one end of the reactive element 210, and the capacitor unit 220 is connected to the other end of the reactive element 210. The bias circuit 240 supplies bias voltages to the respective capacitor units 141 and 220. The capacitor unit 141 is configured like the capacitor unit 220.

Further, the reactive element 210, the capacitor unit 220, and the bias circuit 240 form the variable capacitance circuit 200.

In such a way, in the seventh embodiment of the present technology, the variable capacitance circuit 200 is disposed inside the antenna matching circuit 140, so that impedance matching between the subsequent-stage circuit and the antenna is achieved by changing the capacitance value.

Note that, the above-mentioned embodiments are examples for implementing the present technology, and the matters in the embodiments have correspondence relations with matters to define the invention in Claims. In a similar manner, the matters to define the invention in Claims have correspondence relations with the matters in the embodiments of the present technology denoted by the same names. However, the present technology is not limited to the embodiments, and various modifications of the embodiments may be implemented without departing from the gist of the present technology.

Note that, the present technology can also take the following configurations.

(1)
A variable capacitance circuit including:
a capacitor unit including plural semiconductor elements connected in series, the plural semiconductor elements each having a capacitance value based on a bias voltage applied thereto;
a reactive element connected to the capacitor unit; and
a bias circuit configured to apply the bias voltage to each of the plural semiconductor elements.

(2)
The variable capacitance circuit according to Item (1),
in which the plural semiconductor elements include respective transistors, and
the bias circuit applies, as the bias voltage, any of an on voltage for turning on the transistors and an off voltage for turning off the transistors.

(3)
The variable capacitance circuit according to Item (2),
in which the off voltage includes plural voltages different from each other, and
the bias circuit applies any of the on voltage and the plural voltages as the bias voltage.

(4)
The variable capacitance circuit according to Item (2) or (3),
in which at least two of the transistors have different gate widths.

(5)
The variable capacitance circuit according to any one of Items (2) to (4),
in which the transistors each include a transistor including a gate electrode with a linear shape.

(6)
The variable capacitance circuit according to Item (1),
in which the plural semiconductor elements each include a diode pair circuit including a pair of diodes having anodes connected to each other, and
the bias circuit applies any of a forward voltage and a backward voltage to the pair of diodes individually as the bias voltage.

(7)
The variable capacitance circuit according to any one of Items (1) to (6),
in which plural array circuits connected in parallel are disposed in the capacitor unit, and
the plural semiconductor elements are disposed in each of the plural array circuits.

(8)
The variable capacitance circuit according to any one of Items (1) to (7),
in which the reactive element is connected to the capacitor unit in series.

(9)
The variable capacitance circuit according to Item (8),
in which the reactive element includes an antenna radiator.

(10)
The variable capacitance circuit according to Item (8),
in which the capacitor unit is connected to each end of the reactive element.

(11)
The variable capacitance circuit according to any one of Items (1) to (7),
in which the reactive element is connected to the capacitor unit in parallel.

(12)
A wireless communication device including:
a capacitor unit including plural semiconductor elements connected in series, the plural semiconductor elements each having a capacitance value based on a bias voltage applied thereto;
a reactive element connected to the capacitor unit;
a bias circuit configured to apply the bias voltage to each of the plural semiconductor elements; and
an antenna radiator connected to at least one of the capacitor unit or the reactive element.

REFERENCE SIGNS LIST

100 Wireless communication device
110 Antenna radiator
120 Impedance matching circuit
121, 221 to 227, 263 to 266, 273 to 276, 283 to 286, 291 Resistive element
122 Signal source
130 Antenna tuning circuit
140 Antenna matching circuit
141, 220 Capacitor unit
150 Subsequent-stage circuit
200 Variable capacitance circuit
210, 211 Reactive element
231 to 233, 261, 262, 271, 272, 281, 282 MOS transistor
240 Bias circuit
241, 242, 250 Variable bias circuit
251 nMOS transistor
252 pMOS transistor
253 Variable voltage supply unit
260, 270, 280 Array circuit
290 Diode pair circuit
292, 293 Diode
311 Drain electrode
312 Gate electrode
313 Source electrode
314 Finger
321, 325 Parasitic resistance
322, 324 Parasitic inductance
323 Drain-source capacitance
326 Gate-drain capacitance
327 Gate-source capacitance

What is claimed is:
1. A variable capacitance circuit, comprising:
a capacitor unit including plural semiconductor elements connected in series, the plural semiconductor elements each having a capacitance value based on a bias voltage applied thereto;
a reactive element connected to the capacitor unit; and a bias circuit configured to apply the bias voltage to each of the plural semiconductor elements,
wherein the plural semiconductor elements include respective transistors,
wherein the bias circuit applies, as the bias voltage, any of an on voltage for turning on the transistors and an off voltage for turning off the transistors, and
wherein at least two of the transistors have different gate widths.

2. A variable capacitance circuit, comprising:
a capacitor unit including plural semiconductor elements connected in series, the plural semiconductor elements each having a capacitance value based on a bias voltage applied thereto;
a reactive element connected to the capacitor unit; and
a bias circuit configured to apply the bias voltage to each of the plural semiconductor elements,
wherein the reactive element is connected to the capacitor unit in series, and
wherein the reactive element includes an antenna radiator.

3. The variable capacitance circuit according to claim 1,
wherein the off voltage includes plural voltages different from each other, and
wherein the bias circuit applies any of the on voltage and the plural voltages as the bias voltage.

4. The variable capacitance circuit according to claim 1,
wherein plural array circuits connected in parallel are disposed in the capacitor unit, and
wherein the plural semiconductor elements are disposed in each of the plural array circuits.

5. The variable capacitance circuit according to claim 4,
wherein the reactive element is connected to the capacitor unit in parallel.

6. The variable capacitance circuit according to claim 1,
wherein the reactive element is connected to the capacitor unit in series.

7. The variable capacitance circuit according to claim 6,
wherein plural array circuits connected in parallel are disposed in the capacitor unit, and
wherein the plural semiconductor elements are disposed in each of the plural array circuits.

8. The variable capacitance circuit according to claim 1,
wherein the reactive element is connected to the capacitor unit in parallel.

9. A variable capacitance circuit, comprising:
a capacitor unit including plural semiconductor elements connected in series, the plural semiconductor elements each having a capacitance value based on a bias voltage applied thereto;
a reactive element connected to the capacitor unit; and
a bias circuit configured to apply the bias voltage to each of the plural semiconductor elements,
wherein the plural semiconductor elements include respective transistors,
wherein the bias circuit applies, as the bias voltage, any of an on voltage for turning on the transistors and an off voltage for turning off the transistors, and
wherein the transistors each include a transistor including a gate electrode with a linear shape.

10. The variable capacitance circuit according to claim 9,
wherein at least two of the transistors have different gate widths.

11. The variable capacitance circuit according to claim 9,
wherein the off voltage includes plural voltages different from each other, and
wherein the bias circuit applies any of the on voltage and the plural voltages as the bias voltage.

12. The variable capacitance circuit according to claim 9,
wherein plural array circuits connected in parallel are disposed in the capacitor unit, and
wherein the plural semiconductor elements are disposed in each of the plural array circuits.

13. The variable capacitance circuit according to claim 9,
wherein the reactive element is connected to the capacitor unit in parallel.

14. A variable capacitance circuit, comprising:
a capacitor unit including plural semiconductor elements connected in series, the plural semiconductor elements each having a capacitance value based on a bias voltage applied thereto;
a reactive element connected to the capacitor unit; and
a bias circuit configured to apply the bias voltage to each of the plural semiconductor elements,
wherein the plural semiconductor elements each include a diode pair circuit including a pair of diodes having anodes connected to each other, and
wherein the bias circuit applies any of a forward voltage and a backward voltage to the pair of diodes individually as the bias voltage.

15. The variable capacitance circuit according to claim 14,
wherein plural array circuits connected in parallel are disposed in the capacitor unit, and
wherein the plural semiconductor elements are disposed in each of the plural array circuits.

16. The variable capacitance circuit according to claim 14,
wherein the reactive element is connected to the capacitor unit in parallel.

17. The variable capacitance circuit according to claim 2,
wherein the plural semiconductor elements include respective transistors, and
wherein the bias circuit applies, as the bias voltage, any of an on voltage for turning on the transistors and an off voltage for turning off the transistors.

18. A variable capacitance circuit, comprising:
a capacitor unit including plural semiconductor elements connected in series, the plural semiconductor elements each having a capacitance value based on a bias voltage applied thereto;
a reactive element connected to the capacitor unit; and
a bias circuit configured to apply the bias voltage to each of the plural semiconductor elements,
wherein the reactive element is connected to the capacitor unit in series, and
wherein the capacitor unit is connected to each end of the reactive element.

19. The variable capacitance circuit according to claim 18,
wherein the plural semiconductor elements include respective transistors, and
wherein the bias circuit applies, as the bias voltage, any of an on voltage for turning on the transistors and an off voltage for turning off the transistors.

20. A wireless communication device comprising:
a capacitor unit including plural semiconductor elements connected in series, the plural semiconductor elements each having a capacitance value based on a bias voltage applied thereto;
a reactive element connected to the capacitor unit;
a bias circuit configured to apply the bias voltage to each of the plural semiconductor elements; and an antenna radiator connected to at least one of the capacitor unit or the reactive element.

* * * * *